United States Patent
Reinberg

[19]

[11] Patent Number: 6,150,226
[45] Date of Patent: Nov. 21, 2000

[54] SEMICONDUCTOR PROCESSING METHODS, METHODS OF FORMING CAPACITORS, METHODS OF FORMING SILICON NITRIDE, AND METHODS OF DENSIFYING SILICON NITRIDE LAYERS

[75] Inventor: Alan R. Reinberg, Boise, Id.

[73] Assignee: Micron Technology, Inc., Boise, Id.

[21] Appl. No.: 09/018,230

[22] Filed: Feb. 3, 1998

[51] Int. Cl.[7] .................................................. H01L 21/31
[52] U.S. Cl. ........................ 438/381; 438/775; 438/777; 438/791; 438/792; 438/393
[58] Field of Search ..................................... 438/775, 791, 438/777, 788, 393, 792, 772, 381

[56] References Cited

U.S. PATENT DOCUMENTS

| | | | |
|---|---|---|---|
| 4,262,631 | 4/1981 | Kubacki | 118/723 |
| 4,435,447 | 3/1984 | Ito et al. | 427/94 |
| 4,980,307 | 12/1990 | Ito et al. | 438/791 |
| 5,237,188 | 8/1993 | Iwai et al. | 438/775 |
| 5,330,936 | 7/1994 | Ishitani | 438/775 |
| 5,393,702 | 2/1995 | Yang et al. | 438/775 |
| 5,398,641 | 3/1995 | Shih | 438/788 |
| 5,821,142 | 10/1998 | Sung et al. | 438/253 |

*Primary Examiner*—Mary Wilczewski
*Assistant Examiner*—Yung A. Lin
*Attorney, Agent, or Firm*—Wells, St. John, Roberts, Gregory & Matkin PS

[57] ABSTRACT

In one aspect, the invention includes a method of densifying a silicon nitride layer comprising: after forming the silicon nitride layer, exposing the silicon nitride layer to atomic nitrogen, the exposing not increasing a thickness of the silicon nitride layer by more than about 10 Angstroms. In another aspect, the invention includes a method of densifying a silicon nitride layer comprising: after forming the silicon nitride layer, exposing the silicon nitride layer to atomic nitrogen in the substantial absence of a silicon-containing gas. In another aspect, the invention includes a method of forming a capacitor comprising: a) providing a silicon-containing first capacitor electrode having a surface; b) forming a dielectric layer over the surface of the first capacitor electrode, the forming the dielectric layer comprising: i) forming a silicon nitride layer at the surface of the silicon-comprising substrate, the silicon nitride layer being formed to a thickness and having one or more pinholes extending into it; and ii) after forming the silicon nitride layer, exposing the silicon nitride layer to atomic nitrogen to close the one or more pinholes; and c) forming a second capacitor electrode over the dielectric layer; the first capacitor electrode, second capacitor electrode and dielectric layer together comprising a capacitor.

39 Claims, 4 Drawing Sheets

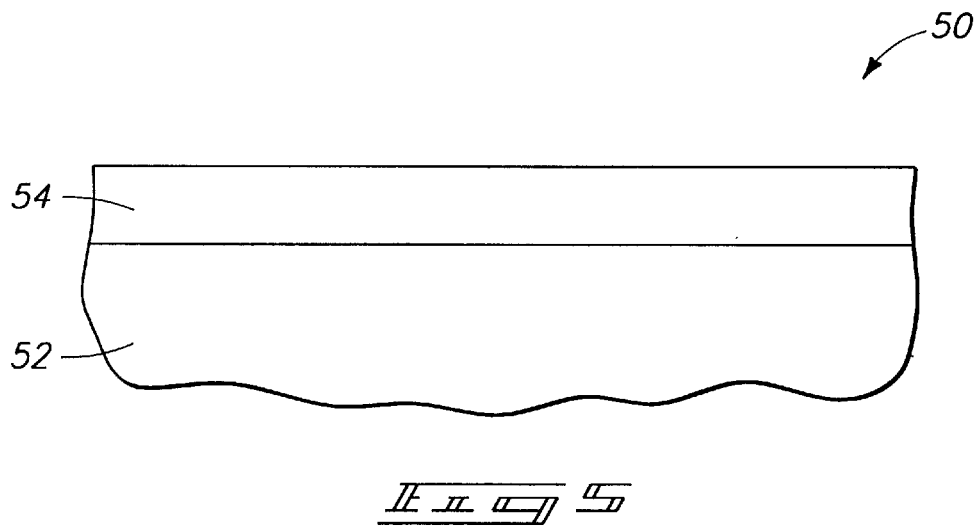
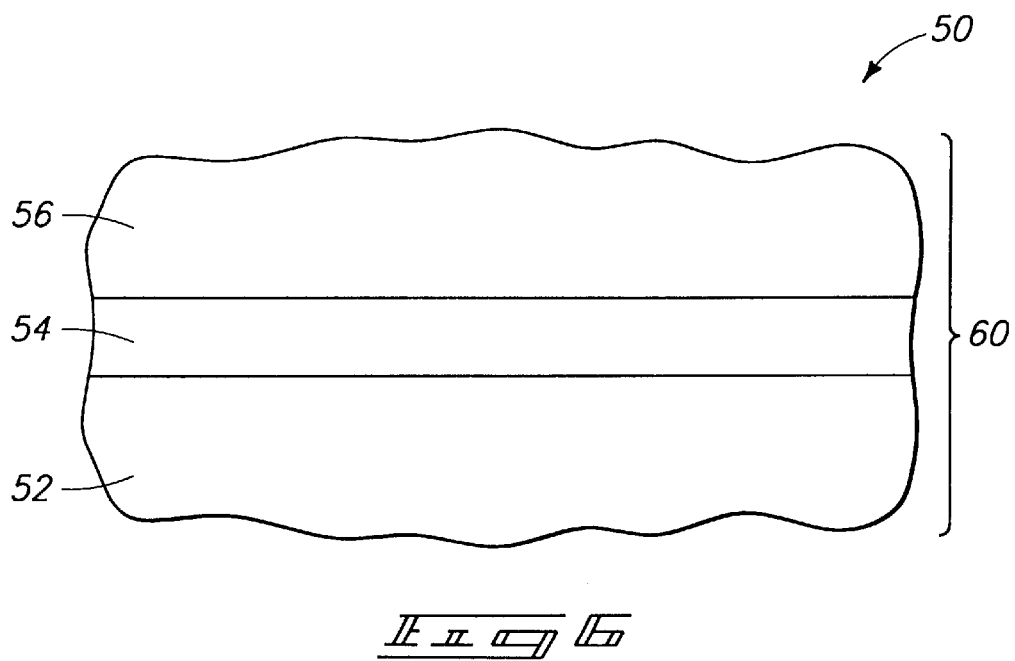

SEMICONDUCTOR PROCESSING METHODS, METHODS OF FORMING CAPACITORS, METHODS OF FORMING SILICON NITRIDE, AND METHODS OF DENSIFYING SILICON NITRIDE LAYERS

TECHNICAL FIELD

The invention pertains to semiconductor processing methods of forming and utilizing silicon nitride.

BACKGROUND OF THE INVENTION

As DRAMs increase in memory cell density, there is a continuing challenge to maintain sufficiently high storage capacitance despite decreasing cell area. Additionally, there is a continuing goal to further decrease cell area. One principal way of increasing cell capacitance is through cell structure techniques. Such techniques include three-dimensional cell capacitors, such as trenched or stacked capacitors.

A capacitor is comprised of two conductive electrodes separated by a non-conducting dielectric layer. The dielectric layer is preferably comprised of one or more materials having a very high dielectric constant and low leakage current characteristics. Example materials include $SiO_2$ and $Si_3N_4$. $Si_3N_4$ is typically preferred due to its better dielectric properties than $SiO_2$. Numerous other capacitor dielectric materials have been and are being developed in an effort to meet the increasingly stringent requirements associated with the production of smaller and smaller capacitor devices used in higher density integrated circuitry. Most of these materials do, however, add increased process complexity or cost over utilization of conventional $Si_3N_4$ and $SiO_2$ capacitor dielectric materials. Yet the smaller and thinner capacitors being produced in next generation DRAM density are reaching the limit of the utility of using $Si_3N_4$ as a viable capacitor dielectric material.

Specifically, $Si_3N_4$ is typically deposited by low pressure chemical vapor deposition (i.e., any chemical vapor deposition process at less than or equal to 100 Torr). This does, however, undesirably produce very small pin-holes through thin layers of less than 200 Angstroms, with the pin-holes becoming particularly problematic in layers less than or equal to about 50 Angstroms thick. These pin-holes undesirably reduce film density and result in undesired leakage current in operation. Once developed, these leakage current inducing pin-holes are difficult to repair. One technique is to form the capacitor dielectric layer as a composite of a $SiO_2/Si_3N_4/SiO_2$ composite. The strapping $SiO_2$ layers is are utilized principally to cure or plug the pin-holes formed in the $Si_3N_4$. Conventional circuitry today provides the $SiO_2/Si_3N_4/SiO_2$ composite layer to thicknesses approaching 50 Angstroms. However, it is difficult at best to obtain thinner composite layers which achieve desirable dielectric film properties for such capacitor dielectric layers. Part of the difficulty in obtaining thinner composite layers is due to the $SiO_2$ having a lower dielectric constant than $Si_3N_4$. Accordingly, a capacitor dielectric construction having $SiO_2$ must be thinner than a construction comprising only $Si_3N_4$ to achieve an equal capacitance.

A semiconductor wafer fragment 10 comprising a prior art capacitor construction 14 is illustrated in FIG. 1. Wafer fragment 10 comprises a substrate 12. Substrate 12 can comprise, for example, a monocrystalline silicon wafer lightly doped with a p-type background dopant. To aid in interpretation of this disclosure and the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Capacitor assembly 14 is formed over substrate 12, and comprises a first capacitor electrode 16, a dielectric layer 18, and a second capacitor electrode 20. First capacitor electrode 16 and second capacitor electrode 20 can comprise, for example, conductively doped polysilicon, and can be formed by, for example, chemical vapor deposition. Dielectric layer 18 comprises the above-discussed $SiO_2/Si_3N_4/SiO_2$ composite. The formation of dielectric layer 18 is illustrated in the expanded process views of FIG. 2 and FIG. 3.

Referring to FIG. 2, wafer fragment 10 is illustrated at a preliminary step in formation of capacitor construction 14 (shown in FIG. 1). A first $SiO_2$ layer 22 has been formed over first cell electrode layer 16, and a silicon nitride layer 24 has been formed over first $SiO_2$ layer 22. Silicon nitride layer 24 comprises a plurality of pinholes 26 extending into it. Some of pinholes 26 extend entirely through layer 24. Oxide layer 22 ensures that first capacitor electrode 16 is not exposed through any such pinholes 26 extending entirely through layer 24.

Referring to FIG. 3, a second $SiO_2$ layer 30 is formed over silicon nitride layer 24 to fill pinholes 26. First and second silicon dioxide layers 22 and 30, together with silicon nitride layer 24, form dielectric layer 18. After formation of silicon dioxide layer 30, capacitor electrode 20 (FIG. 1) can be formed to complete construction of capacitor assembly 14 (FIG. 1).

It would be desirable to develop alternative methods of forming capacitor dielectric layers wherein one or both of oxide layers 22 and 30 is substantially eliminated.

SUMMARY OF INVENTION

In one aspect, the invention encompasses a method of densifying a silicon nitride layer. A silicon nitride layer is formed and subsequently exposed to atomic (elemental) nitrogen. The exposing does not increase a thickness of the silicon nitride layer by more than about 10 Angstroms.

In another aspect, the invention encompasses a method of densifying a silicon nitride layer. A silicon nitride layer is formed and subsequently exposed to atomic nitrogen in the substantial absence of a silicon-containing gas.

In another aspect, the invention encompasses a method of forming a capacitor. A silicon-containing first capacitor electrode is provided. The first capacitor electrode has a surface. A dielectric layer is formed over the surface of the first capacitor electrode by forming a silicon nitride layer at the surface of the silicon-comprising substrate. The silicon nitride layer is formed to a thickness and has one or more pinholes extending into it. The silicon nitride layer is exposed to atomic nitrogen to close the one or more pinholes. The thickness of the silicon nitride layer does not increase by more than 10 Angstroms as the silicon nitride layer is exposed to the atomic nitrogen. The silicon nitride layer is substantially not exposed to a silicon-containing gas as it is exposed to atomic nitrogen. The atomic nitrogen is formed by microwave excitation of $N_2$. A second capacitor electrode is formed over the dielectric layer. The first capacitor electrode, second capacitor electrode and dielectric layer together comprise a capacitor assembly.

BRIEF DESCRIPTION OF THE DRAWINGS

Preferred embodiments of the invention are described below with reference to the following accompanying drawings.

FIG. 5 is a view of the FIG. 4 wafer fragment shown at a processing step subsequent to that of FIG. 4.

FIG. 6 is a view of the FIG. 4 wafer fragment shown at a processing step subsequent to that of FIG. 5.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
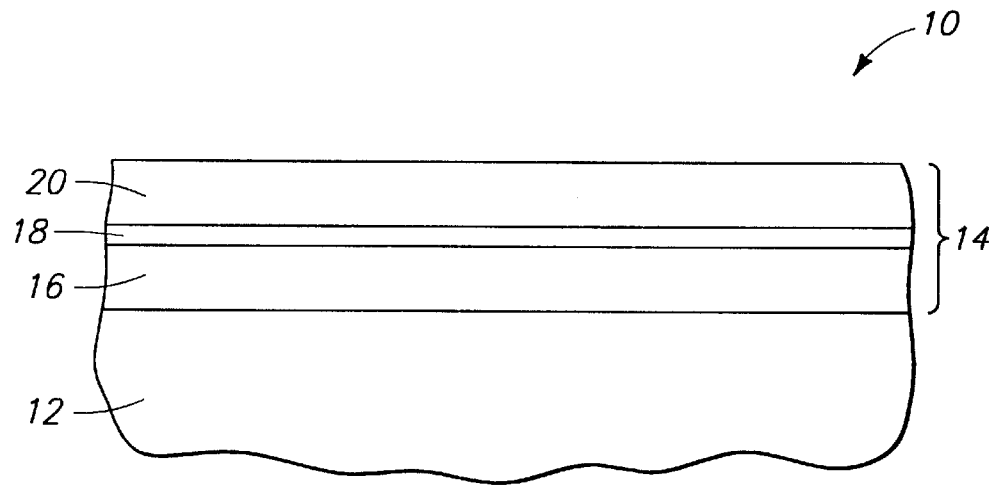
FIG. 1 is a fragmentary, diagrammatic, cross-sectional view of a semiconductor wafer fragment illustrating a prior art capacitor construction.
Figure 2:
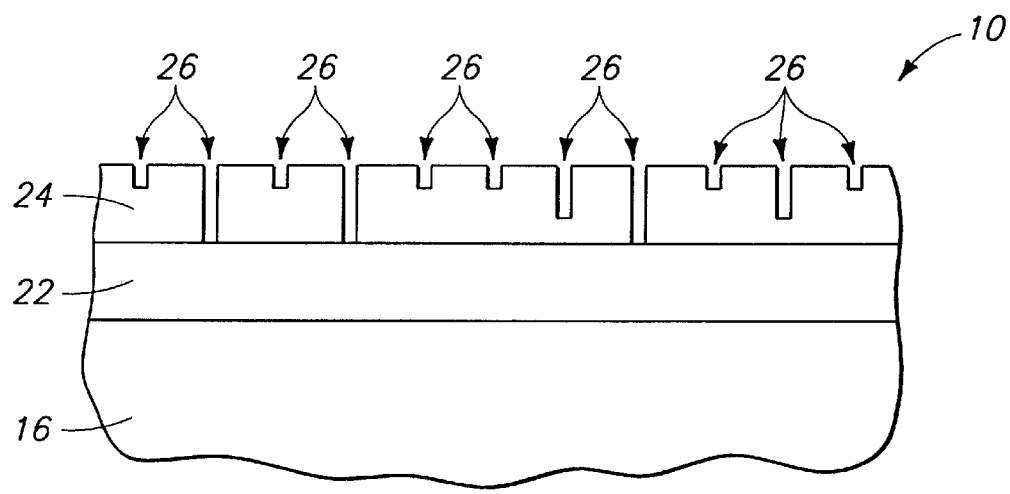
FIG. 2 is a fragmentary, diagrammatic, cross-sectional view of a semiconductor wafer fragment illustrating a preliminary prior art processing step for formation of the prior art capacitor construction of FIG. 1. The FIG. 2 view is expanded relative to the FIG. 1 view.
Figure 3:
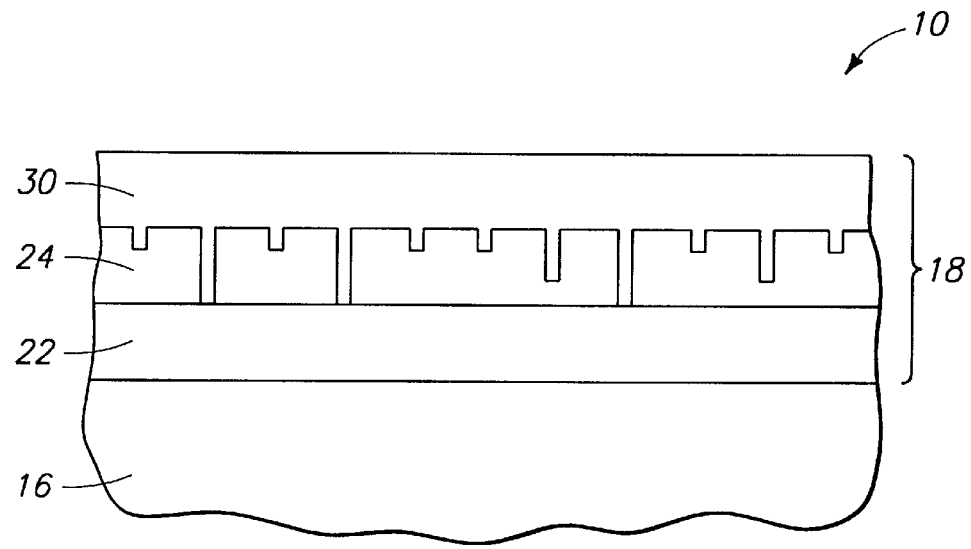
FIG. 3 is a view of the FIG. 2 wafer fragment at a prior art processing step subsequent to that of FIG. 2.
Figure 4:
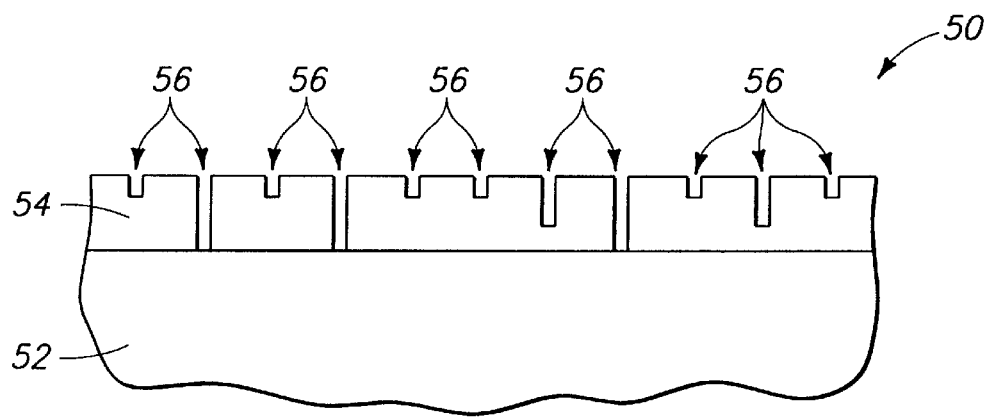
FIG. 4 is a fragmentary, diagrammatic, cross-sectional view of a semiconductor wafer fragment being processed according to a method of the present invention.

Referring to FIG. 4, a semiconductor wafer fragment 50 is illustrated at a preliminary processing step of a method of the present invention. Specifically, wafer fragment 50 is illustrated at a preliminary processing step in the formation of a capacitor construction. Wafer fragment 50 comprises a first capacitor electrode layer 52, and a silicon nitride dielectric layer 54 formed over first capacitor electrode layer 52. Preferably, cell electrode layer 52 comprises silicon, such as conductively doped polysilicon or hemispherical grain polysilicon. Layers 52 and 54 can be formed by conventional methods, such as the methods described in the "Background" section pertaining to formation of layers 16 and 24 (FIGS. 1–3), respectively. A difference between the preliminary capacitor construction of wafer fragment 50 and the prior art capacitor construction of wafer fragment 10 (FIGS. 1–3) is that silicon nitride layer 54 of wafer fragment 50 is formed against electrode layer 52, rather than being separated from electrode layer 52 by a silicon dioxide layer. In less preferred embodiments of the invention, such separating silicon dioxide layer can be formed.

Silicon nitride layer 54 comprises a plurality of pinholes 56 extending into it. Some of pinholes 56 extend entirely through layer 54, while others do not. Those pinholes which extend entirely through layer 54 expose a surface of underlying cell electrode layer 52.

Referring to FIG. 5, wafer fragment 50 is treated according to a method of the present invention to fill pinholes 56 with nitride, and to thereby densify silicon nitride layer 54. Specifically, the present invention encompasses exposure of silicon nitride layer 54 to atomic (elemental) nitrogen to thereby grow silicon nitride from unbonded, or incompletely bonded, silicon present within nitride layer 54. Incompletely bonded silicon is known to persons of ordinary skill to comprise so-called "dangling bonds". Accordingly, the present invention encompasses reacting dangling bonds of silicon present in silicon nitride layer 54 with atomic nitrogen to fill pinholes 56 (FIG. 4). Additionally, the invention encompasses reacting atomic nitrogen with exposed silicon surfaces which are not comprised by layer 54, such as exposed surfaces of underlying polysilicon layer 52.

The atomic nitrogen utilized in a method of the present invention can be generated from $N_2$ by exposing the $N_2$ to microwave energy, such as by exposing it to a radio frequency source. Methods of forming atomic nitrogen are described with reference to FIGS. 7 and 8.

Figure 7:
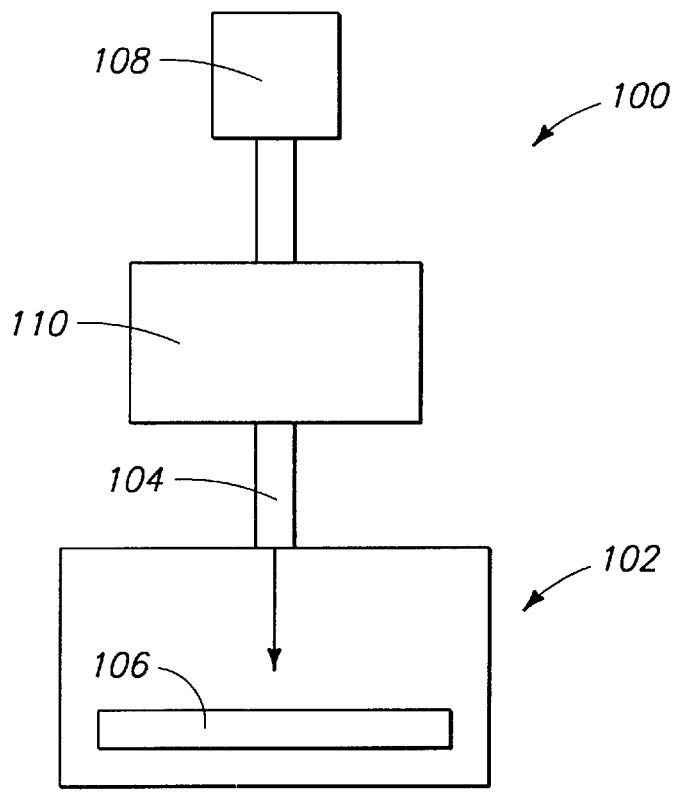
FIG. 7 is a schematic, diagrammatic view of a semiconductor wafer fragment in a processing chamber and being processed according to a first embodiment method of the present invention.

Referring first to FIG. 7, a first embodiment method of forming atomic nitrogen is illustrated. FIG. 7 shows a wafer processing apparatus 100 comprising a reaction chamber 102 and a gas inlet 104 connected to reaction chamber 102. A semiconductive wafer 106 is within chamber 102. Semiconductive wafer 106 comprises a layer of silicon nitride having pinholes therein. Preferably, chamber 102 comprises a furnace configured for heating the silicon nitride layer to a temperature of at least 500° C., and to maintain the silicon nitride layer at a pressure of from about 10 mTorr to about 10 Torr, during exposure of the silicon nitride layer to atomic nitrogen. More preferably, chamber 102 is configured to heat a silicon nitride layer to a temperature of from about 500° C. to about 700° C. during such exposing.

Processing apparatus 100 further comprises a source of $N_2$ gas 108 and a microwave exposure chamber 110. In operation, $N_2$ gas flows from source 108 into microwave exposure chamber 110 whereupon the gas is subjected to microwave radiation to generate atomic nitrogen from the gas. The atomic nitrogen then flows through gas inlet 104 and into processing chamber 102 whereupon it interacts with the silicon nitride layer to fill the pinholes.

As discussed above in the background section, it is generally desired to keep dielectric layers very thin in modern capacitor constructions. It is therefore preferable that a method of the present invention not significantly increase a thickness of a treated silicon nitride layer. Accordingly, preferred methods of the present invention comprise exposing a silicon nitride layer to atomic nitrogen while not increasing the thickness of the nitride layer by more than about 10 Angstroms.

A method to restrict a thickness increase of a silicon nitride layer during its exposure to atomic nitrogen is to limit the amount of silicon-containing gases present. The absence of silicon-containing gases during exposure of a silicon nitride layer to atomic nitrogen precludes the atomic nitrogen from reacting with silicon-containing gases to form additional silicon nitride over the layer. Preferably, the exposure of a silicon nitride layer to atomic nitrogen occurs in an ambient comprising a substantial absence of any silicon-containing gases, and more preferably occurs in an ambient comprising an absolute absence of any silicon-containing gases. For purposes of interpreting this disclosure and the claims that follow, a substantial absence of a silicon-containing gas is defined to be less than a flow of 0.1 standard cubic centimeters (sccm)/minute for a wafer having a surface area of about 50 square inches (an eight inch diameter wafer). The flow rate corresponding to "substantial absence" will vary with wafer size; the flow rate being proportional to a wafer's surface area.

It is found that treatment of a silicon nitride layer by a method of the present invention is a self-limiting process. The treated layer grows a small amount (preferably less than 10 Angstroms) and then substantially ceases growth as the number of dangling silicon bonds is reduced. Accordingly, an exposure time of a treated silicon nitride layer to atomic nitrogen is generally not critical in methods of the present invention. Typical exposure times are from about 10 minutes to about 30 minutes.

In one aspect of the invention, a silicon nitride layer is formed within reaction chamber 102 prior to treatment of the silicon nitride layer with atomic nitrogen. For instance, chamber 102 can be a chemical vapor deposition (CVD) reactor. A silicon precursor and a nitrogen precursor are fed into reactor 102 to chemical vapor deposit silicon nitride onto substrate 106. The chemical vapor depositing is then substantially ceased, and preferably entirely ceased. Subsequently, any remaining silicon precursor is flushed from the reactor. The silicon nitride layer is then treated with atomic nitrogen to fill pinholes present in the silicon nitride layer.

Figure 8:
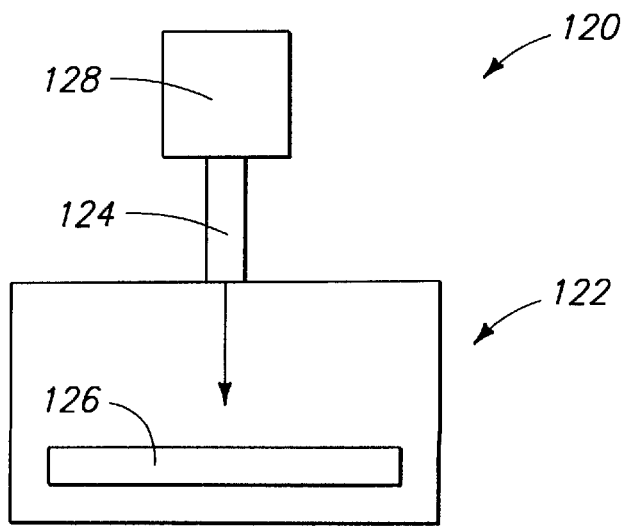
FIG. 8 is a schematic, diagrammatic view of a semiconductor wafer fragment in a processing chamber and being processed according to a second method of the present invention.

Referring to FIG. 8, a second embodiment processing apparatus 120 is illustrated. Apparatus 120 comprises a reaction chamber 122, which can be a chemical vapor deposition furnace. An inlet 124 is provided in reaction chamber 122 and configured for allowing introduction of a gas into chamber 122. A semiconductive wafer substrate 126 is provided within chamber 122. Substrate 126 comprises a layer of silicon nitride having pinholes. A source of $N_2$ 128 is provided in fluid communication with inlet 124 such that $N_2$ is flowed from source 128 and into chamber 122. Microwave radiation is introduced into chamber 122 to form atomic nitrogen from the $N_2$. The atomic nitrogen interacts with the silicon nitride on wafer 126 to fill the pinholes. Preferred operating temperatures and conditions for processing apparatus 120 are identical to those discussed above with reference to apparatus 100 of FIG. 7.

FIG. 6 illustrates further processing of wafer fragment 50, after filling pinholes in silicon nitride layer 54, to form a capacitor construction 60. Specifically, a second cell electrode layer 56 is formed over silicon nitride layer 54. First cell electrode layer 52, second cell electrode layer 56 and silicon nitride layer 54 together comprise capacitor structure 60.

In contrast to the prior art capacitor construction 14 (FIGS. 1–3), there is preferably no oxide formed between silicon nitride layer 54 and second capacitor layer 56 of capacitor construction 60. Occasionally, a thin layer of native oxide will form between silicon nitride layer 54 and upper layer 56. However, in preferred methods of the present invention, any oxide formed between capacitor electrode 56 and silicon nitride layer 54 will be less than 5 Angstroms thick, and most preferably there will be no oxide between capacitor electrode layer 56 and silicon nitride layer 54. Also, it is noted that occasionally a thin oxide will form between cell electrode layer 52 and silicon nitride layer 54, simply due to native oxide growth over layer 52 prior to provision of layer 54. In preferred methods of the present invention, such oxide will be less than 5 Angstroms thick, and preferably there will be no oxide-containing layers between first capacitor electrode 52 and silicon nitride layer 54.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of densifying a silicon nitride layer comprising: after forming the silicon nitride layer, exposing the silicon nitride layer to atomic nitrogen, only the atomic nitrogen being a reactive nitrogen species reacting to densify the silicon nitride layer while not increasing a thickness of the silicon nitride layer by more than about 10 Angstroms.

2. The method of claim 1 further comprising forming the atomic nitrogen by exposing $N_2$ to microwave energy.

3. A method of densifying a silicon nitride layer comprising: after forming the silicon nitride layer, exposing the silicon nitride layer to atomic nitrogen in the substantial absence of a silicon-containing gas for a period of between about 10 minutes to about 30 minutes, the atomic nitrogen densifying the silicon nitride layer.

4. The method of claim 3 further comprising forming the atomic nitrogen by exposing $N_2$ to microwave energy.

5. The method of claim 3 wherein the exposing occurs in a furnace and further comprising forming the atomic nitrogen by exposing $N_2$ to microwave energy at a location upstream from the furnace.

6. The method of claim 3 wherein the exposing occurs in a furnace and further comprising forming the atomic nitrogen by exposing $N_2$ to microwave energy within the furnace.

7. The method of claim 3 wherein the silicon nitride layer is maintained at a temperature of at least about 500° C. but less than 700° C. during the exposing.

8. The method of claim 3 wherein the silicon nitride layer is maintained at a temperature of from about 500° C. to less than 700° C. during the exposing, and wherein the silicon nitride layer is subjected to a pressure of from about 10 mTorr to about 10 Torr during the exposing.

9. The method of claim 3 wherein the silicon nitride layer is maintained at a temperature of from about 500° C. to less than 700° C. during the exposing, wherein the silicon nitride layer is subjected to a pressure of from about 10 mTorr to about 10 Torr during the exposing, and wherein the exposing occurs for a time of from about 10 minutes to about 30 minutes.

10. The method of claim 3 wherein the substantial absence is an absolute absence of silicon-containing gas.

11. A method of forming $Si_3N_4$ comprising:

providing a substrate in a CVD reactor;

feeding a silicon precursor and a nitrogen precursor into the reactor to chemical vapor deposit $Si_3N_4$ onto the substrate;

substantially ceasing the chemical vapor depositing; and treating the $Si_3N_4$ with atomic nitrogen in the substantial absence of silicon-containing gases, the atomic nitrogen being of a sufficient concentration to densify the $Si_3N_4$ within a period of time between about 10 minutes to about 30 minutes.

12. The method of claim 11 wherein the treating occurs within the reactor.

13. The method of claim 11 wherein the treating comprises an absolute absence of silicon-containing gases.

14. A method of forming $Si_3N_4$ comprising:

providing a substrate in a CVD reactor;

feeding a silicon precursor and a nitrogen precursor into the reactor to chemical vapor deposit $Si_3N_4$ onto the substrate;

substantially ceasing the chemical vapor depositing; and treating the $Si_3N_4$ with atomic nitrogen to densify the $Si_3N_4$ without increasing a thickness of the $Si_3N_4$ by more than about 10 Angstroms; the treating consisting of the atomic nitrogen reacting with silicon of the silicon nitride layer.

15. The method of claim 14 wherein the treating occurs within the reactor.

16. A semiconductor processing method comprising:

providing a silicon-containing substrate having a surface;

forming a silicon nitride layer at the surface of the silicon-comprising substrate, the silicon nitride layer being formed to a thickness and having one or more holes extending through it to the underlying silicon-containing substrate; and after forming the silicon nitride layer, exposing the silicon nitride layer to atomic nitrogen, the atomic nitrogen being of a sufficient concentration to close the one or more holes within a period of time less than about 30 minutes.

17. The method of claim 16 wherein the exposing does not increase a thickness of the silicon nitride layer by more than about 10 Angstroms.

18. The method of claim 16 wherein the silicon nitride layer is maintained at a temperature of at least 500° C. but less than 700° C. during the exposing.

19. The method of claim 16 wherein the silicon nitride layer is maintained at a temperature of from about 500° C. to less than 700° C. during the exposing.

20. The method of claim 16 further comprising forming the atomic nitrogen by exposing $N_2$ to microwave energy.

21. The method of claim 16 wherein the exposing occurs in a furnace and further comprising forming the atomic nitrogen by exposing $N_2$ to microwave energy at a location upstream from the furnace.

22. The method of claim 16 wherein the exposing occurs in a furnace and further comprising forming the atomic nitrogen by exposing $N_2$ to microwave energy within the furnace.

23. The method of claim 16 wherein the exposing comprises substantially not exposing the silicon nitride layer to a silicon-containing gas.

24. The method of claim 23 wherein the substantially not exposing the silicon nitride layer to a silicon-containing gas is absolutely not exposing the silicon nitride layer to a silicon-containing gas.

25. The method of claim 23 wherein the exposing comprises substantially no increase of the silicon nitride layer thickness.

26. The method of claim 23 wherein the silicon nitride layer is maintained at a temperature of at least 500° C. but less than 700° C. during the exposing.

27. The method of claim 23 wherein the silicon nitride layer is maintained at a temperature of from about 500° C. to less than 700° C. during the exposing.

28. The method of claim 23 further comprising forming the atomic nitrogen by exposing $N_2$ to microwave energy.

29. A method of forming a capacitor comprising:

providing a silicon-containing first capacitor electrode having a surface;

forming a dielectric layer over the surface of the first capacitor electrode, the forming the dielectric layer comprising:

forming a silicon nitride layer at the surface of the silicon-containing first capacitor electrode, the forming the silicon nitride layer comprising chemical vapor deposition using a silicon precursor and a nitrogen precursor, the silicon nitride layer being formed to a thickness and having one or more pinholes extending into it; and after forming the silicon nitride layer, exposing the silicon nitride layer to atomic nitrogen, the atomic nitrogen being of a sufficient concentration to close the one or more pinholes within a period of time less than about 30 minutes; and forming a second capacitor electrode over the dielectric layer; the first capacitor electrode, second capacitor electrode and dielectric layer together comprising a capacitor.

30. The method of claim 29 wherein the exposing does not increase a thickness of the silicon nitride layer by more than about 10 Angstroms.

31. The method of claim 29 wherein the exposing comprises substantially not exposing the silicon nitride layer to a silicon-containing gas.

32. The method of claim 31 wherein the substantially not exposing the silicon nitride layer to a silicon-containing gas is absolutely not exposing the silicon nitride layer to a silicon-containing gas.

33. A method of forming a capacitor comprising:

providing a silicon-containing first capacitor electrode having a surface;

forming a dielectric layer over the surface of the first capacitor electrode, the forming the dielectric layer comprising:

forming a silicon nitride layer at the surface of the silicon-containing first capacitor electrode, the forming the silicon nitride layer comprising chemical vapor deposition using a silicon precursor and a nitrogen precursor, the silicon nitride layer being formed to a thickness and having one or more pinholes extending into it; and after forming the silicon nitride layer, exposing the silicon nitride layer to atomic nitrogen to close the one or more pinholes, the exposing not increasing the thickness of the nitride layer by more than about 10 Angstroms and comprising substantially not exposing the nitride layer to a silicon-containing gas, the silicon nitride layer being maintained at a temperature of at least about 500° C. to less than 700° C. during the exposing, the atomic nitrogen being formed by microwave excitation of $N_2$, the atomic nitrogen being the only reactive species reacting with the silicon nitride layer to close the one or more pinholes; and forming a second capacitor electrode over the dielectric layer; the first capacitor electrode, second capacitor electrode and dielectric layer together comprising a capacitor.

34. The method of claim 33 further comprising not forming an oxide-containing layer between the silicon nitride layer and the second capacitor electrode.

35. The method of claim 33 further comprising not forming an oxide-containing layer between the first and second capacitor electrodes.

36. The method of claim 33 wherein the silicon nitride layer is maintained at a temperature of from about 500° C. to less than 700° C. during the exposing.

37. The method of claim 33 wherein the atomic nitrogen bonds with silicon in the silicon nitride layer.

38. The method of claim 33 wherein the pinholes extend through the silicon nitride layer to the surface of the silicon-containing first capacitor electrode, and wherein the atomic nitrogen bonds with silicon at the surface of the silicon-containing first capacitor electrode.

39. The method of claim 33 wherein the silicon nitride layer is formed to a thickness of no greater than 50 Angstroms.

* * * * *

UNITED STATES PATENT AND TRADEMARK OFFICE
CERTIFICATE OF CORRECTION

PATENT NO. : 6,150,226
DATED : November 21, 2000
INVENTOR(S) : Alan R. Reinberg

It is certified that error appears in the above-identified patent and that said Letters Patent are hereby corrected as shown below:

Col. 1, line 49   Delete "is" after the word --layers--

Signed and Sealed this

First Day of May, 2001

Attest:

NICHOLAS P. GODICI

*Attesting Officer*   Acting Director of the United States Patent and Trademark Office